United States Patent [19]

Nishizawa

[11] 4,160,259
[45] Jul. 3, 1979

[54] SEMICONDUCTOR DEVICE

[75] Inventor: Jun-ichi Nishizawa, Sendai, Japan

[73] Assignee: Zaidan Hojin Handotai Kenkyu Shinkokai, Sendai, Japan

[21] Appl. No.: 757,583

[22] Filed: Dec. 27, 1976

[51] Int. Cl.² .................................... H01L 29/76
[52] U.S. Cl. .............................. 357/22; 307/299 R; 357/30
[58] Field of Search .............. 357/22, 1, 30, 21, 23, 357/15; 307/299 R; 331/107 G

[56] References Cited

U.S. PATENT DOCUMENTS

| | | | |
|---|---|---|---|
| 2,794,863 | 6/1957 | Roosbroeck | 357/22 |
| 3,508,084 | 4/1970 | Warner, Jr. | 357/23 |
| 3,634,780 | 1/1972 | Bosch et al. | 331/107 G |
| 3,800,246 | 3/1974 | Bosch et al. | 331/107 G |
| 4,037,245 | 7/1977 | Ferro | 357/22 |

OTHER PUBLICATIONS

S. Handel, "The Possibilities of the Tecnectron" *British Communications and Electronics*, Apr. 1960, pp. 282–285.

Primary Examiner—James W. Davie
Attorney, Agent, or Firm—Cushman, Darby & Cushman

[57] ABSTRACT

In a transistor structure having a pair of current electrodes and a control electrode, at least one control electrode is added to vary the negative feed-back resistance in the current path. In a typical example, both the triode-like and the pentode-like characteristics are provided by the control in the voltage applied to the additional control electrode for varying the negative feed-back resistance $r_s$, thereby changing the product $G_m \cdot r_s$ from less than unity to greater than unity where $G_m$ is the transconductance.

15 Claims, 46 Drawing Figures

SEMICONDUCTOR DEVICE

BACKGROUND OF THE INVENTION (a) Field of the Invention

This invention relates to a semiconductor device, and more particularly to a semiconductor device having variable feed-back effect.

(b) Description of the Prior Art

In conventional semiconductor circuits, when the degree of feed-back is desired to be varied for performing mixing, modulation or logic operation, the negative feed-back voltage itself is varied to alter the characteristic of the circuit. Namely, the signal voltages are superposed outside the semiconductor device. According to such a method, however, the power required for the control becomes large and the effect of the characteristic change upon operation is transmitted reversely to the output circuit through the circuit for applying the negative feed-back voltage, to give undesired reaction to the circuit.

SUMMARY OF THE INVENTION

Therefore, this invention is intended to solve the conventional drawbacks as described above and an object of this invention is to provide a semiconductor device capable of effectively varying the characteristic with small power consumption.

Another object of this invention is to provide a semiconductor device having a pair of current electrodes and at least two control electrodes, one being utilized as the conventional control electrode and the other being utilized for varying the negative feed-back resistance of the device.

A further object of this invention is to provide a semiconductor device having a variable $G_m \cdot r_s$ product.

Other objects, features and advantages of this invention will become apparent from the following description of the preferred embodiments when taken in conjunction with the accompanying drawings.

DESCRIPTION OF THE PREFERRED EMBODIMENTS

Figure 1A:
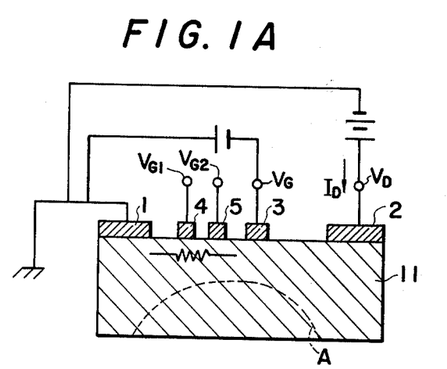
FIGS. 1A and 1B are a schematic cross-section and a schematic top plan view of a semiconductor device according to an embodiment of this invention.
Figure 1B:
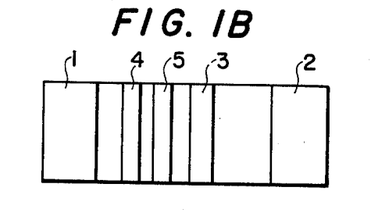

FIGS. 1A and 1B show a semiconductor device according to an embodiment of this invention. In FIG. 1A, a simplified external circuit is also shown.

Two main electrodes 1 and 2 are formed on one principal surface of a semiconductor wafer 11. Between these two electrodes a third (control) electrode 3 is formed to change the characteristic of the voltage $V_D$ vs. the current $I_D$ flowing between the main electrodes 1 and 2. These electrodes 1, 2 and 3 constitute a similar structure to that of the conventional field effect transistor, but the impurity concentration in the semiconductor bulk 11 is selected to be low enough to enable the semiconductor device to have triode-like characteristics, i.e. operable as a static induction transistor proposed by the present inventor (J. Nishizawa, IEEE Trans. Electron Devices ED-22, No. 4, pp. 185-197, April 1975). In addition to the above structure, at least one electrode (two are shown in the figure) 4 (5, . . .) is formed between one main electrode 1 and the third electrode 3 so as to change the resistance $r_s$ of the semiconductor region through which the current flows. Namely, the negative feed-back resistance $r_s$ can be changed by the voltage $V_{GI}$ applied to the electrode 4. When a plurality of such auxiliary control electrodes 4, 5, . . . are provided, an appropriate set of control voltages may be applied thereto. The control electrodes 3, 4, 5 . . . are formed of any of junction, MOS or Schottky structures.

In other words, the static induction transistor has similar operational principle to that of triode vacuum tube. The negative voltages applied to the auxiliary control electrodes serve to vary the cross-section of the current path and thereby the value of the negative feed-back resistance $r_s$.

According to a simplified analysis, when a current $I_D$ flows between the two electrodes 1 and 2 through the semiconductor region 11 and a voltage $V_G$ is applied to the control electrode 3, the resistance $r_s$ between the electrodes 1 and 3 generates a voltage drop $r_s \cdot I_D$ therebetween and raises the potential at the electrode 3 and hence the control voltage $V_G$ applied to the electrode 3 has a similar effect to a control voltage of $V_G - r_s \cdot I_D$. Since the control voltage $V_G$ is usually of negative polarity, the effective control voltage is $-(|V_G| +$ $r_s \cdot I_D$). According to this embodiment, another electrode 4 is additionally provided for changing the resistance $r_s$ and hence the magnitude of the negative feed-back can be very easily changed. The transconductance $G_m'$ when the current $I_D$ is directly varied by the third electrode 3 can be represented by $$G_m' = G_m/1 + G_m \cdot r_s$$

where $G_m$ is the true transconductance when there is no negative feed-back resistance $r_s$. Since $\Delta V_G \cdot G_m' = \Delta I_D$, the ratio of change in the current $I_D$ with respect to the change in the voltage $V_{Gl}$ applied to the fourth electrode 4 is represented by $$\frac{\partial I_D}{\partial V_{Gl}} = \left(\frac{\partial(V_G \cdot G_m')}{\partial r_s}\right) \left(\frac{\partial r_s}{\partial V_{Gl}}\right) =$$

$$- \left(\frac{G_m'}{1 + G_m \cdot r_s}\right)^2 V_G \left(\frac{\partial r_s}{\partial V_{Gl}}\right) =$$

$$- (G_m')^2 V_G \left(\frac{\partial r_s}{\partial V_{Gl}}\right).$$

Thus, the ratio $\gamma$ of the control effect on the current $I_D$ by the voltage on the fourth electrode 4 to that by the voltage on the third electrode 3 becomes $$\gamma = \frac{(\partial I_D/\partial V_{Gl})}{G_m'} = - V_G \cdot G_m' \left(\frac{\partial r_s}{\partial V_{Gl}}\right).$$

When this ratio $\gamma$ is greater than unity, the control effect by the fourth electrode 4 is greater than that by the third electrode 3. Even if the negative feed-back resistance $r_s$ is extremely large and hence the transconductance $G_m'$ is very small, it is easy to arrange this value greater than 1. For example, this can be achieved by keeping the impurity concentration of the semiconductor region 11 uniform and narrowing the width of the conductive region in the semiconductor region at which the negative feed-back resistance becomes $r_s$, e.g. by providing a recessed portion in the region on the opposite side to that provided with the electrodes as shown by the dotted line in the figure, to increase the value of $(\partial r_s/\partial V_{Gl})$.

It will be apparent that the shape of the recessed portion is not limited to that shown in the figure. Evidently, it is possible to give similar or greater effect by providing the electrodes 3, 4, 5, ... on the both surfaces of the semi-conductor wafer 11.

Once negative feed-back is effected, the value of $r_s$ increases. When the product of the transconductance $G_m$ and the negative feed-back resistance $r_s$ approaches unity, i.e. $G_m \cdot r_s \simeq 1$, the value of $r_s$ increases further. This is because the voltage drop due to the current $I_D$, i.e. $r_s \cdot I_D$, serves additively to the control voltage $V_{Gl}$ applied to the fourth electrode 4 (when there are more than one electrodes 4, 5, ... between the first and the third electrodes 1 and 3, the voltage drop serves additively to the respective control voltages $V_{G1}$, $V_{G2}$, ... applied to the electrodes 4, 5, ...). Thus, the control voltages have greater effects than that of their value. Therefore, the most effective use is to change the negative feed-back resistance $r_s$ from the region $1 > G_m \cdot r_s$ to the region $1 < G_m \cdot r_s$ by the application of the control voltage $V_{G1}$. Namely, the value of the negative feed-back resistance $r_s$ can be varied widely by the additional control voltages $V_{G1}$, $V_{G2}$, ... applied to the additional control electrodes 4, 5, ... and when the product of the transconductance $G_m$ and the negative feed-back resistance $r_s$ becomes greater than unity, $G_m \cdot r_s > 1$, the negative feed-back resistance $r_s$ increases further more by the negative feed-back as described above.

Figure 2A:
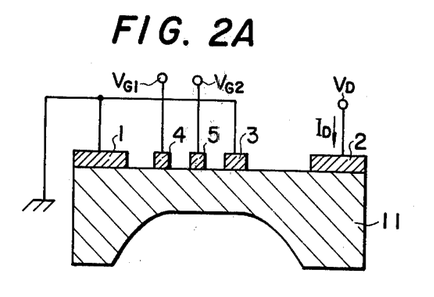
FIGS. 2A and 2B are a schematic cross-section and a schematic top plan view of a semiconductor device according to another embodiment of this invention.
Figure 2B:
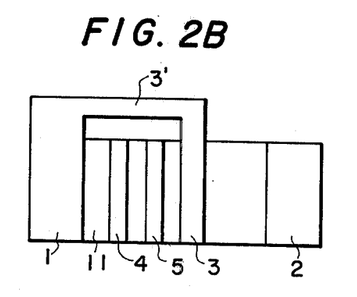

FIGS. 2A and 2B show another embodiment of a semiconductor device, in which the first main electrode and the third electrode are short-circuited and the width of the conductive region in the semiconductor bulk 11 is made narrow in the region located below the control electrodes. In this embodiment, the third control electrode near the drain electrode 2 is connected to the source electrode 1. The connection of the third electrode 3 and the first electrode 1 is achieved with metal or low resistivity material. In this structure, control voltages are applied to the electrodes 4 and 5 and the negative feed-back resistance $r_s$ and hence the current $I_D$ can be effectively varied thereby.

Figure 3A:
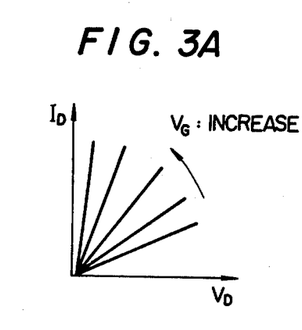
FIGS. 3A to 3C are characteristic curves showing an example of the variable characteristic curves of a semiconductor device according to this invention.
Figure 3B:
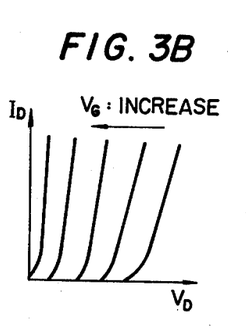
Figure 3C:
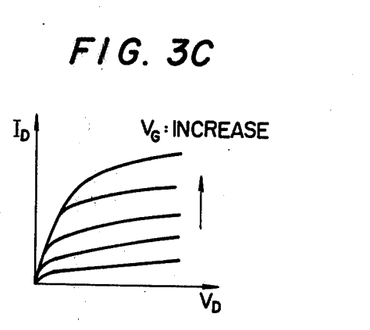

The change in the characteristic curves by the change in the negative feed-back resistance $r_s$ will be described below. From the relation $G_m' = G_m/(1 + G_m \cdot r_s)$, it can be seen that when $G_m \cdot r_s < 1$, the relation becomes $G_m' \simeq G_m$ and when $G_m \cdot r_s > 1$, the relation becomes $G_m' \simeq 1/r_s$. The characteristic curves corresponding to these changes are shown in FIGS. 3A and 3B ($G_m \cdot r_s < 1$) and in FIG. 3C ($G_m \cdot r_s > 1$). Generally, when the voltage $V_G$ on the third electrode increases (considering the polarity), the main current $I_D$ increases. FIG. 3A shows the case when $G_m \cdot r_s < 1$ and the current path (channel) below the third electrode 3 is not occupied by the depletion layer. This can be called the variable resistance characteristic. FIG. 3B shows the characteristic when $G_m \cdot r_s < 1$ and the current channel is pinched off by the depletion layer. In this case, the $I_D$ vs. $V_D$ characteristic becomes triode-like characteristic where the current $I_D$ does not saturate with respect to the voltage $V_D$. FIG. 3C shows the case when $G_m \cdot r_s > 1$ and the $I_D$ vs. $V_D$ characteristic becomes pentode-like characteristic where the current $I_D$ becomes saturated with respect to the voltage $V_D$ since the negative feed-back due to the negative feed-back resistance $r_s$ is large.

The variation in the negative feed-back resistance $r_s$ constitutes a resistance-capacitance distribution coefficient circuit with the distributed capacitance of the third electrode 3. High frequency components applied to the third electrode 3, however, becomes used up in the negative feed-back resistance $r_s$ and not effectively applied to the depletion layer under the third electrode. Thus, the high frequency response becomes worse. This phenomenon can be utilized as a voltage-controlled notch filter. In this way, the frequency dependence of the characteristic of a semiconductor device can be varied by the negative feed-back resistance $r_s$.

Figure 4:
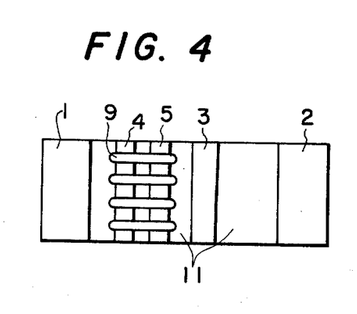
FIG. 4 is a top plan view of a semiconductor device having a modified structure on the basis of the structure of FIGS. 1A and 1B, in which the fourth electrode in FIGS. 1A and 1B is divided into a plurality of electrodes.

FIG. 4 shows an embodiment in which the fourth and the fifth electrodes 4 and 5 in the structure of FIGS. 1A and 1B are divided into a plurality of segments for decreasing the distributed capacitance. Further, the regions 9 between adjacent electrode segments are recessed or bored as shown by the solid line to restrict the current path only under the electrode segments, thereby enhancing the control effect on the negative feed-back resistance $r_s$. The non-conductive region 9 may be provided by other means such as selective oxidation. The electrode segments are connected by metal lead deposited on the surface, etc. It will be apparent that such division of electrode may be arbitrarily modified in accordance with the purpose. For example, either one or all of the electrodes 3, 4, and 5 may be divided.

Figure 5:
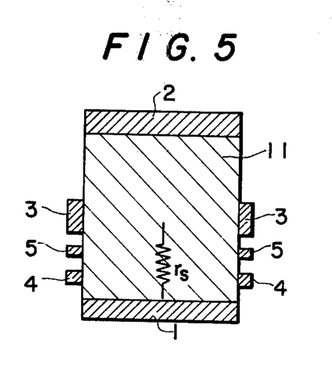
FIG. 5 is a cross-section of a vertical type semi-conductor device according to another embodiment of this invention.

FIG. 5 shows an embodiment of the vertical structure. Namely, FIG. 5 is a cross-section. The main electrodes 1 and 2 are formed on the opposite principal surfaces of a semiconductor chip 11, and the control electrodes 3, 4 and 5 are formed on the side surface. The operation of this structure will be apparent from the foregoing description.

Figure 6:
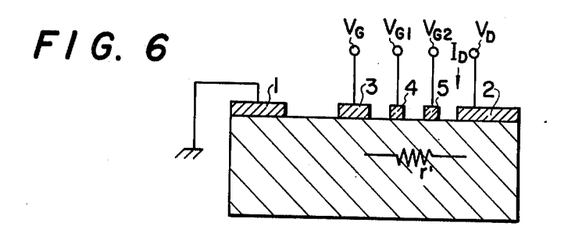
FIG. 6 is a cross-section of a semiconductor device according to another embodiment of this invention.

FIG. 6 shows another embodiment in which the fourth and fifth electrodes 4 and 5 are disposed between the second main electrode 2 and the third electrode 3 in place of between the first main electrode 1 and the third electrode 3. In this embodiment, when a voltage $V_{G1}$ is applied to the fourth electrode 4 to decrease the main current $I_D$, a voltage drop $I_D \cdot r'$ occurs in the channel and hence the main current $I_D$ decreases. Thus, the effect of the voltage $V_G$ applied to the third electrode 3 decreases. When a positive voltage is applied to the third electrode, carriers injected from the third electrode decreases and the carrier density in the region between the first and the third electrodes decreases, thereby increasing the resistance in this region. As the result, the current between the first and the second main electrodes also decreases.

It will be apparent that such modifications as the division of the electrodes and the vertical structure as shown in FIGS. 4 and 5 on the basis of the embodiment of FIGS. 1A and 1B are also applicable to this embodiment.

Next, the manufacture of the semiconductor device according to this invention will be described, first taking the junction type as an example.

Figure 7A:
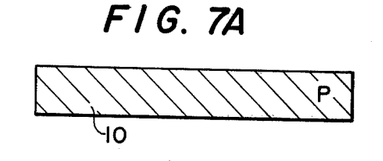
FIGS. 7A to 7J are cross-sections showing various steps of manufacture of the semiconductor device of FIGS. 1A and 1B.
Figure 7B:
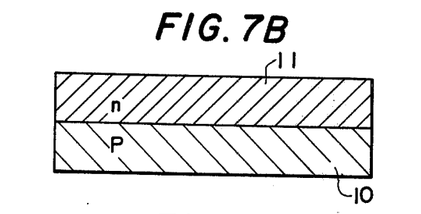
Figure 7C:
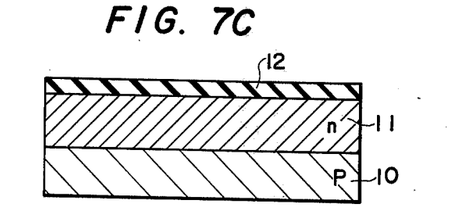
Figure 7D:
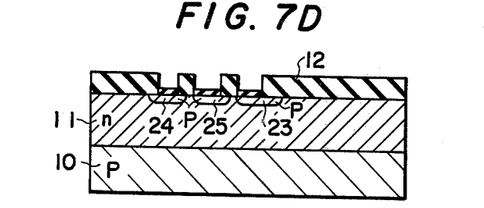
Figure 7E:
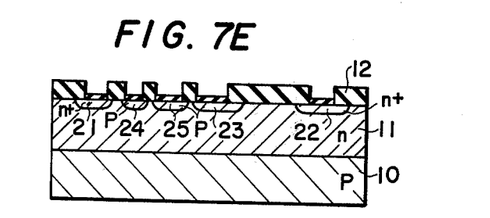
Figure 7F:
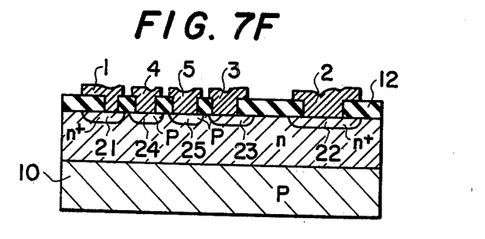
Figure 7G:
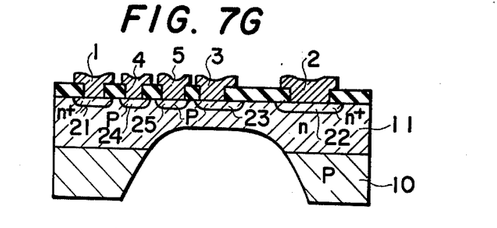
Figure 7H:
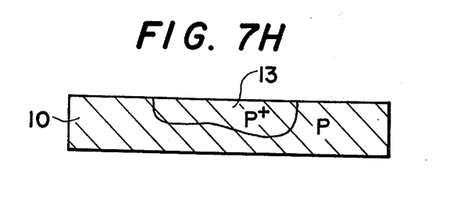
Figure 7I:
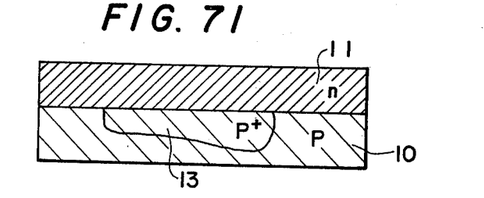
Figure 7J:
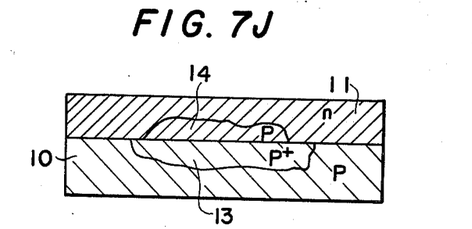

FIGS. 7A to 7J show how the semiconductor device of FIGS. 1A and 1B is manufactured. First, a p-type silicon substrate 10 of high resistivity is prepared (FIG. 7A). An n-type epitaxial layer 11 is grown on the substrate 10 (FIG. 7B). The epitaxial growth is achieved by flowing a mixed gas of $H_2$, $SiCl_4$ and $AsCl_3$ on the silicon substrate 10 heated to 1000° C. Next, the substrate 10 is subjected to oxidation in a mixed gas of oxygen and steam to grow a silicon oxide film 12 of about 500 nm on the surface of the epitaxial layer 11 (FIG. 7C). Then, windows are bored through the oxide film 12 by the photoetching technique using photoresist KPR, etc., and boron is diffused selectively into the epitaxial layer 11 through these windows 12 in a mixed gas of $N_2$, $O_2$ and $BBr_3$ at 1000° C. to form p-type regions 23, 24 and 25 (FIG. 7D). Here, a new oxide film is grown on the exposed silicon surface. Again, windows are bored in the oxide film 12 in the positions of the main electrodes 1 and 2 by the photoetching technique and arsenic is selectively diffused into the epitaxial layer 11 through these windows at 1100° C. in a mixed gas of $N_2$, $O_2$ and $AsCl_3$ to form heavily doped n-type regions 21 and 22 for forming ohmic contacts (FIG. 7E). Then, the oxide film formed in the diffusion process on the regions 21, 22, 23, 24 and 25 are selectively etched by the photoetching technique to expose the silicon surface. On the oxide and the exposed silicon surface, an aluminium film is vapor-deposited and selectively etched away to leave respective electrodes 1, 2, 3, 4, and 5 by the photoetching technique (FIG. 7F). In the case when a recessed portion corresponding to the portion indicated by the dotted line A in FIG. 1A is to be provided for narrowing the width of the current path of the main current $I_D$ and for raising the control efficiency, selective jet etch using a mixed solution of HF, $HNO_3$ and $CH_3COOH$ may be subjected to the rear surface of the crystal (FIG. 7G). Alternatively, boron may be selectively diffused into the substrate 10 before the growth of the n-type epitaxial layer to form a p-type embedded region 13 of low resistivity (FIG. 7H). Then, the n-type epitaxial layer 11 is grown (FIG. 7I). After the epitaxial growth, the substrate is subjected to a heat treatment at 1200° C. in oxygen to form a p-type region 14 by the out-diffusion to substantially decreasing the width of the current path of the n-type region 11 (FIG. 7J). Similar steps to those of FIGS. 7C to 7G follow thereafter.

Figure 8A:
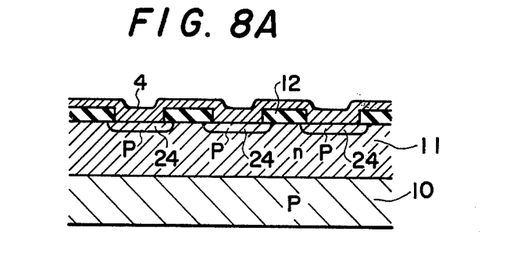
FIGS. 8A and 8B are cross-sections showing examples of the electrode structure to be used in the semiconductor device according to this invention.
Figure 8B:
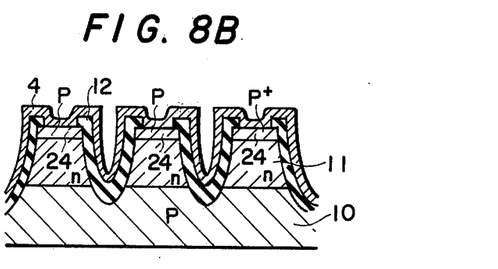

In manufacturing the semiconductor device as shown in FIGS. 2A and 2B, the first and the third electrodes may be bonded with gold wire, etc. Alternatively, an aluminium film may be selectively deposited (deposited and selectively etched) to leave an aluminium electrode short-circuiting the first and the third electrodes on the oxide film 12. For forming divided electrodes as shown in FIG. 4, boron may be selectively diffused to form divided p-type regions 24 and electrically connected with an aluminium film deposited on the silicon chip and the oxide film as shown in FIG. 8A. Alternatively, the current path may be defined by mesa-etching the silicon chip, the cut-away portions extending to the substrate 10 leaving the boron-diffused regions 24 and the underlying epitaxial layer 11 divided as shown in FIG. 8B. The oxide film 12 and the aluminium electrode 4 may be formed after the mesa-etching.

Figure 9A:
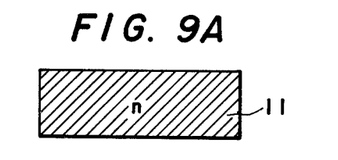
FIGS. 9A to 9I are cross-sections showing various steps of the manufacture of the device of FIG. 5, and FIG. 9J to FIG. 9L are cross-sections showing modifications of the structure of FIG. 9I.
Figure 9B:
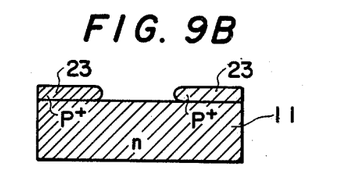
Figure 9C:
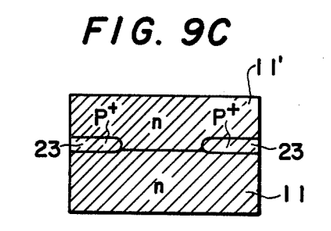
Figure 9D:
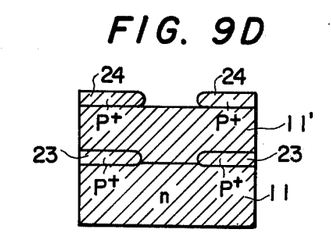
Figure 9E:
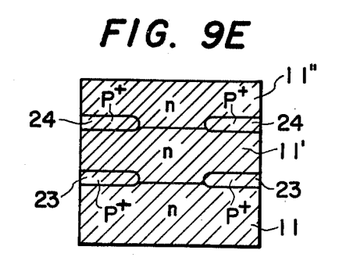
Figure 9F:
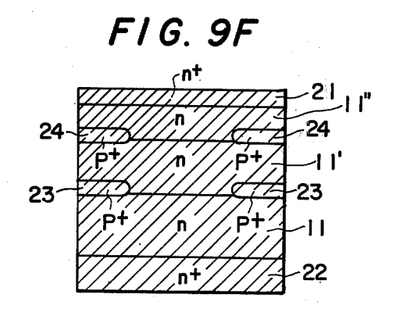
Figure 9G:
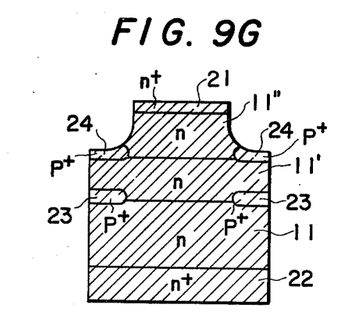
Figure 9H:
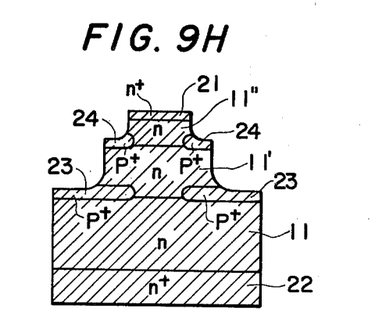
Figure 9I:
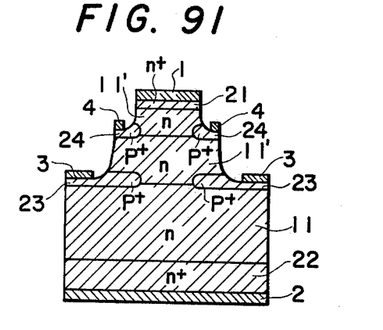

Next, the manufacture of a vertical type structure as shown in FIG. 5 will be described. FIGS. 9A to 9I show an example of the manufacturing steps. First, an n-type silicon chip 11 is prepared (FIG. 9A) and boron is selectively diffused after oxidation and photoetching process (or selective boron diffusion as the case may require) to form a $p^+$ type layer 23 (FIG. 9B). Then, an n-type epitaxial layer 11' is grown thereon (FIG. 9C). Another $p^+$ type layer 24 is formed by the photoetching process (or by the selective boron diffusion as the case may require) (FIG. 9D). Another n-type epitaxial layer 11'' is grown thereon (FIG. 9E). Then, arsenic is diffused to the both principal surfaces to form $n^+$ type layers 21 and 22 (FIG. 9F). The $p^+$ type layer 24 is exposed by the first selective mesa-etching (FIG. 9G) and the $p^+$ type layer 23 is exposed by the second mesa-etching (FIG. 9H). Then, aluminium is vapor-deposited and selectively etched to form the first and second main electrodes 1 and 2, the third and the fourth electrodes 3 and 4 (FIG. 9I).

Instead of forming an $n^+$ type diffused layer 22 in the chip 11, an $n^+$ type silicon chip may be used and an n-type layer 11 may be epitaxially grown thereon.

Figure 9J:
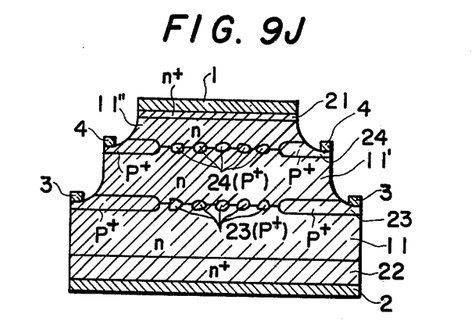

FIG. 9J shows an example of another structure in which $p^+$ type layers or grids 23 and 24 are embedded or buried in an n-type semiconductor region and have at least one end of each connected to electrodes 3 and 4. The manufacturing steps are similar to those of FIGS. 9A to 9I. This structure enhances the control efficiency or allows a layer current flow in total.

Figure 9K:
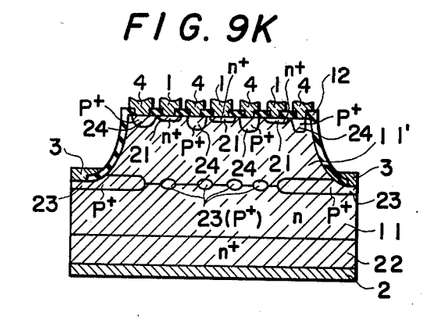

FIG. 9K shows an example of another structure in which the $p^+$ type diffused region 24 and the $n^+$ type diffused region 21 are formed alternatively in the surface portion by oxidation, photoetching and selective diffusion. The $p^+$ type diffused region 24 is formed deeper in the epitaxial layer 11' than the $n^+$ type diffused region 21. Numeral 12 denotes an oxide film.

Figure 9L:
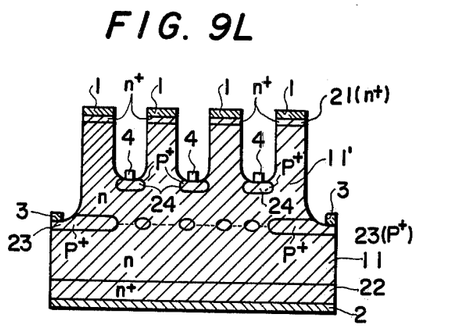

FIG. 9L shows a case when the first main electrode 1 and the fourth electrode 4 are off-set in the vertical position by mesa-etching. The structures of FIGS. 9K and 9L can reduce the distributed capacitance and hence are advantageous for high frequency use.

Figure 10A:
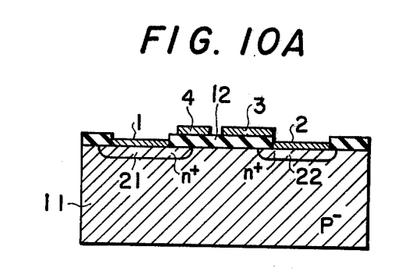
FIGS. 10A to 10C are cross-sections showing the MOS-type structure embodiments.
Figure 10B:
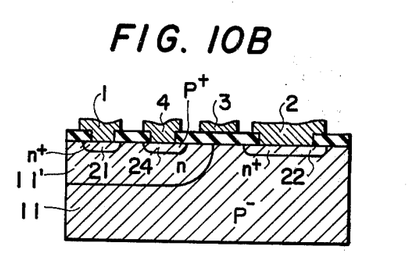
Figure 10C:
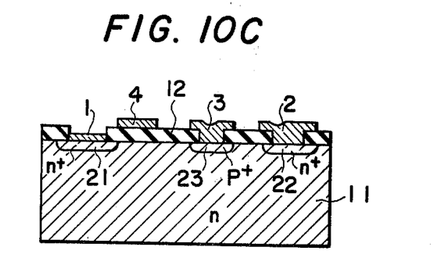

FIGS. 10A to 10C show MOS type structures. In FIG. 10A, n+ type diffused regions 21 and 22 are formed in a p-type high resistivity silicon chip 11. An oxide film 12 and aluminium electrodes 1, 2, 3 and 4 are formed on the silicon chip 11 to form a four-electrode MOS transistor structure. In FIG. 10B, the fourth electrode 4 is formed of a junction-type structure. The n-type epitaxial or diffused layer 11' is formed in the surface portion of the p-type high resistivity layer 11 and an p+ type heavily diffused region 24 is formed therein. The structures of the third and the fourth electrodes may be exchanged. FIG. 10C shows such an example in which the third electrode is formed of a junction type structure and a numeral 23 denotes a p+ type diffused layer. The fourth electrode 4 is of MOS type. The semiconductor region 11 is of n-type.

In the foregoing embodiments, n-channel field effect transistors of junction type and MOS type are described. It is apparent that p-channel devices can be similarly formed and Schottky junction may be used for at least one of the third and the fourth (the fifth, . . .) electrodes.

Next, examples of the characteristics of the semiconductor device according to this invention will be described.

(EXAMPLE 1)

Figure 11A:
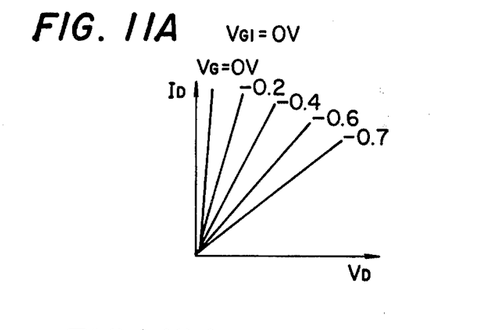
FIGS. 11A and 11B are characteristic curves showing an example of the performance of a semiconductor device according to this invention.
Figure 11B:
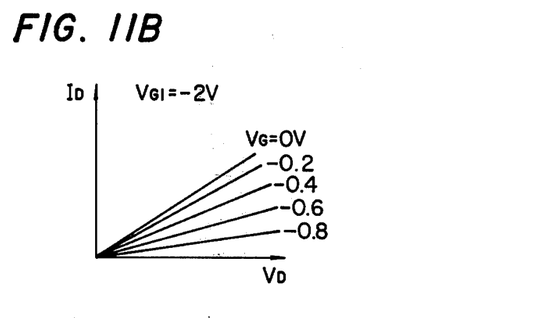

In the vertical structure of FIG. 9J, the n-type region 11 had a thickness of 50 $\mu$m and an impurity (donor) concentration of $N_D = 5 \times 10^{14}$ cm$^{-3}$, the first epitaxial layer 11' had a thickness of 20 $\mu$m an impurity (donor) concentration of $N_D = 5 \times 10^{14}$ cm$^{-3}$, the second epitaxial layer 11" had a thickness of 20 $\mu$m and an impurity (donor) concentration of $N_D = 1 \times 10^{16}$ cm$^{-3}$, the buried grid regions 23 and 24 had a cylinder form of a diameter of 15 $\mu$m and a mutual distance of 30 $\mu$m and an impurity (acceptor) concentration of $10^{19}$ cm$^{-3}$. Characteristics as shown in FIG. 11A corresponding to the condition $G_m \cdot r_s < 1$ were obtained. It can be seen that the resistance is almost constant for a fixed controlling voltage $V_G$ and varies with the change in the controlling voltage $V_G$. Namely, the device works as a variable resistance element when no voltage is applied to the fourth electrode. When a negative bias voltage $V_{G1} = -2$ V is applied to the fourth electrode 4, the product is still less than unity $G_m \cdot r_s < 1$ and the characteristics change into those shown in FIG. 11B, where the absolute resistance of the variable resistance has increased much. More precisely, the application of $-2$ V to the fourth electrode 4 increased the resistance to about ten times as large.

(EXAMPLE 2)

Figure 12A:
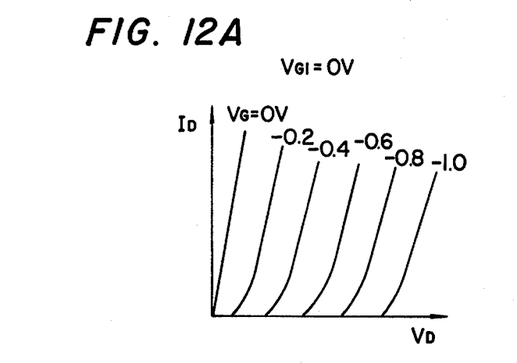
FIGS. 12A and 12B are characteristic curves showing another example of the performance of a semiconductor device according to this invention.
Figure 12B:
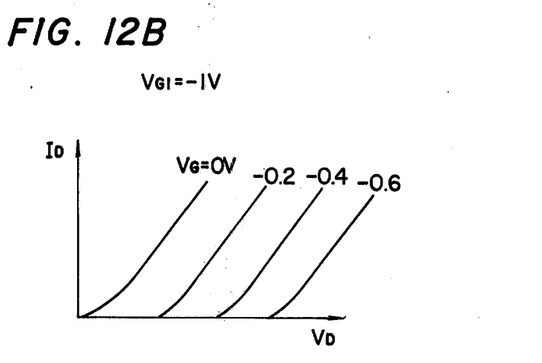

In the similar structure and dimensions with the example 1 but with the impurity concentration in the region 11 reduced to $N_D = 1 \times 10^{13}$ cm$^{-3}$, and the impurity concentration of the first epitaxial layer 11' raised to $N_D = 1 \times 10^{16}$ cm$^{-3}$, the characteristics shown in FIG. 12A were obtained. When a negative bias voltage $V_{G1} = -1$ V was applied to the fourth electrode, the characteristics change into those shown in FIG. 12B. These states also correspond to $G_m \cdot r_s < 1$.

(EXAMPLE 3)

Figure 13A:
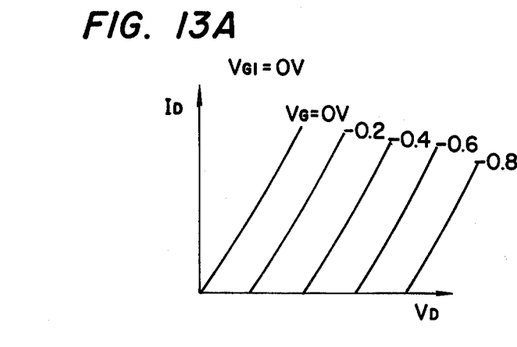
FIGS. 13A and 13B are characteristic curves showing another example of the performance of a semiconductor device according to this invention.
Figure 13B:
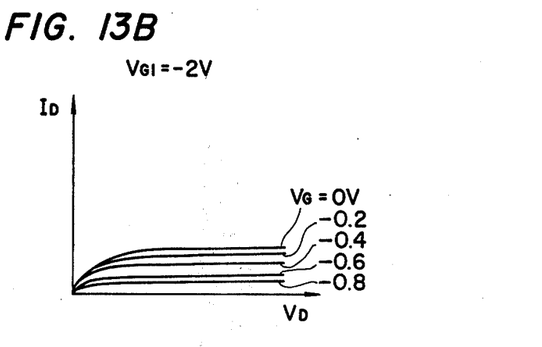

In the similar structure and dimensions as examples 1 and 2, the impurity concentration of the region 11 was selected at $N_D = 1 \times 10^{13}$ cm$^{-3}$, the impurity concentration of the first epitaxial layer 11' at $N_D = 1 \times 10^{14}$ cm$^{-3}$, the p+ type buried region 23 for the fourth electrode 4 was arranged to have a diameter of 30 $\mu$m and a mutual distance of 50 $\mu$m. When the fourth electrode 4 is short-circuited to the first electrode 1, i.e. $V_{G1} = 0$ V, triode-like characteristics as shown in FIG. 13A were obtained. When a negative bias voltage $V_{G1} = -2$ V was applied to the fourth electrode 4, the characteristics change into pentode-like ones as shown in FIG. 13B. The characteristics of FIG. 13A correspond to $G_m \cdot r_s < 1$ and those of FIG. 13B correspond to $G_m \cdot r_s > 1$. Namely, when a negative bias voltage $V_{G1}$ is applied to the fourth electrode 4, the negative feed-back resistance $r_s$ increases to increase the negative feed-back effect. Then the value of $r_s$ increases further. Thus, the transition between the states of $G_m \cdot r_s < 1$ and $G_m \cdot r_s > 1$ can be easily obtained.

(EXAMPLE 4)

In the lateral structure as shown in FIG. 7 but without the fifth electrode 5, the n-type epitaxial layer 11 was arranged to have a thickness of 30 $\mu$m and an impurity concentration of $N_D = 1 \times 10^{13}$ cm$^{-3}$, the third and the fourth electrodes had respective longitudinal lengths of 10 $\mu$m and 3 $\mu$m along the current flow, the p+ type diffused regions 23 and 24 had respective diffusion depths of 10 $\mu$m and 3 $\mu$m, the distance from the right edge of the n+ type diffused region 21 under the first main electrode 1 to the left edge of the p+ type diffused region 24 under the fourth electrode 4 was 5 $\mu$m, the distance from the p+ type diffused region 24 to the left edge of the p+ type region 23 was 30 $\mu$m and the distance from the right edge of the p+ type diffused region 23 to the left edge of the n+ type diffused region 22 was 50 $\mu$m. When the fourth electrode 4 is connected to the first electrode 1, $V_{G1} = 0$ V, the condition $G_m \cdot r_s < 1$ was satisfied and the triode-like characteristics as shown in FIG. 13A were obtained. When a negative voltage $V_{G1} = -1$ V was applied to the fourth electrode 4, the condition $G_m \cdot r_s > 1$ was satisfied and pentode-like characteristics as shown in FIG. 13B were obtained. Namely, the main current $I_D$ decreased considerably by the application of the negative bias voltage for the same second electrode voltage $V_D$.

(EXAMPLE 5)

Figure 14A:
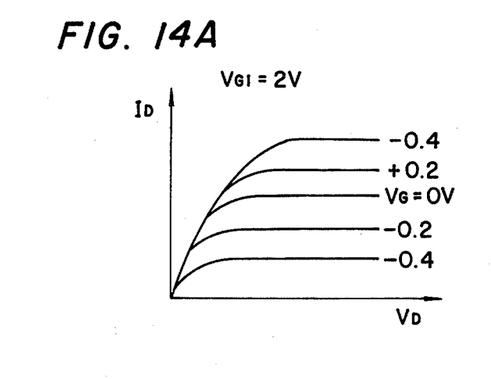
FIGS. 14A and 14B are characteristic curves showing another example of the performance of a semiconductor device according to this invention.
Figure 14B:
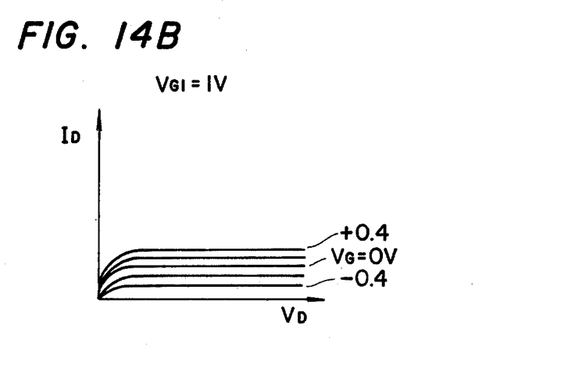

In the MOS structure shown in FIG. 10A, the impurity concentration of the p-type silicon chip 11 was selected at $N_D = 1 \times 10^{14}$ cm$^{-3}$, the so-called channel length between the first and the second main electrodes 1 and 2 was set at 7 $\mu$m, the thickness of the oxide layer 12 was 100 nm, and the distance between the third and the fourth electrodes 3 and 4 was 2 $\mu$m. When a positive voltage $V_{G1} = +2$ V was applied, the current vs. voltage characteristics were as shown in FIG. 14A. When the positive bias voltage was changed to $V_{G1} = +1$ V, the current vs. voltage characteristics changed as shown in FIG. 14B. Both the characteristics of FIGS. 14A and 14B were pendode-like saturated characteristics satisfying the condition $G_m \cdot r_s > 1$, but the current in FIG. 14B was much reduced. Namely, in the latter case, the negative feed-back resistance $r_s$ was increased by decreasing the fourth electrode voltage $V_{G1}$ to increase the negative feed-back effect and hence to decrease the current $I_D$.

As has been described above, various combinations and modifications are possible, but the gist lies in controlling the voltage $V_{G1}$, $V_{G2}$, ... applied to the fourth, the fifth, ... electrodes 4, 5, ... to vary the magnitude of the negative feed-back and hence to effectively vary the effective voltage applied to the third electrode. Since the effective transconductance $G_m'$ can be represented by $G_m' = G_m/(1 + G_m \cdot r_s)$, the characteristics can be changed widely through variations in $G_m$ and $r_s$. These values depend strongly on the structure, dimensions, impurity concentrations, etc. of the device and also on the controlling voltages $V_{G1}$, $V_{G2}$, ... . Therefore, the number of combinations is almost innumerable.

In the foregoing embodiments, the negative feed-back resistance $r_s$ was mainly varied by the electric field, but any method can be adopted to vary the negative feed-back resistance $r_s$ externally.

Figure 15:
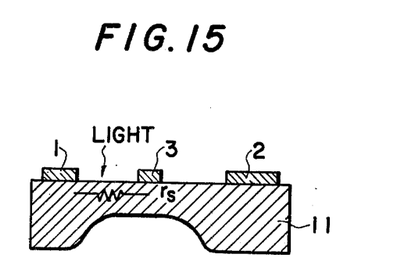
FIG. 15 is a cross-section showing another embodiment of the semiconductor device according to this invention.

For example, light may be irradiated on the surface between the first and the third electrodes as shown in FIG. 15 to utilize the photoconductivity. Namely, when light is irradiated, charge carriers are excited to reduce the negative feed-back resistance $r_s$. Various changes in the characteristic can be provided similarly by this method. For example, when a deep-level impurity such as Fe, Cu or Au is doped in the semiconductor portion to be irradiated by light, the resistance is large and $G_m \cdot r_s > 1$ when no light is irradiated while the resistance decreases and $G_m \cdot r_s < 1$ when light is irradiated.

In another example, carriers may be injected from at least one of the additional fourth, fifth, ... electrodes 4, 5, ... to change the negative feed-back resistance $r_s$. For example, in the structure of FIG. 7F, a forward bias may be applied to the diffused region 24 through the fourth electrode 4 to inject carriers or the conductivity type of the region 24 may be changed to $n^+$ type to inject majority carriers into the channel portion. When carriers are injected in this manner, the resistance decreased. Hence, the condition $G_m \cdot r_s > 1$ can be satisfied when no carriers are injected from the fourth electrode while the condition $G_m \cdot r_s < 1$ be satisfied when carriers are injected.

As has been described above, the negative feed-back resistance can be changed effectively in various ways to change the current vs. voltage characteristics. Such a variable characteristic device can be used as a logic element, and an amplifying oscillation element, and further as a filter, etc. since the frequency dependence can be varied by the control of the negative feed-back resistance $r_s$.

I claim:

1. A field effect semiconductor device of variable characteristics, comprising:
   a high resistivity semiconductor region of one conductivity type including a current channel, the high resistivity semiconductor region having predetermined impurity concentration and dimensions;
   said predetermined impurity concentration and dimensions being chosen such that the semiconductor device selectively exhibits non-saturating current versus voltage characteristics at least in a portion of the operative range of the semiconductor device;
   a pair of current electrode structures formed on the two ends of said current channel and forming ohmic contacts therewith; and
   at least two control electrode means formed adjacent to the current channel for controlling the resistivity of the effective current channel to vary thereby the current versus voltage characteristic of said device.

2. A semiconductor device according to claim 1, wherein the characteristics of the device can be changed from the triode-like unsaturated type to the pentode-like saturated type by the application of an appropriate biasing voltage to at least one of said control electrodes.

3. In a field effect semiconductor device, comprising:
   a semiconductor region of one conductivity type constituting at least one current channel having two ends;
   a pair of current electrode means connected to said two ends of said current channel for receiving a main voltage from an external voltage source; and
   a control electrode means formed adjacent to said current channel for controlling current between said current electrode means, for receiving a control voltage from an external voltage source;
   said semiconductor region having a low impurity concentration and short channel structure with the product of the true transconductance $G_m$ of said semiconductor device and the resistance $r_s$ from one of said current electrode means to said control electrode means being less than unity in at least a portion of the main operative range of said semiconductor device irrespective of the control voltage, in which portion of said main operative range said resistance $r_s$ causes a negative feedback action on said current, resulting in a non-saturating current versus voltage characteristic, the improvement wherein:
   said semiconductor device further includes means disposed between said control electrode means and said one current electrode means for selectively changing the value of said resistance $r_s$ causing the negative feedback action to vary thereby the current versus voltage characteristic of said device.

4. A semiconductor device according to claim 3, wherein said means includes another control electrode formed on said semiconductor region and between said control electrode and said one current electrode for applying an auxiliary control voltage.

5. A semiconductor device according to claim 3, wherein said means includes an optically exposed surface of said semiconductor region for allowing charge carriers to be excited optically in said semiconductor region.

6. A semiconductor device according to claim 4, wherein said another control electrode is divided into a plurality of segments.

7. A semiconductor device according to claim 4, wherein said semiconductor region between said control electrode and said one current electrode has an impurity concentration and dimensions such that the effective current channel is controlled by the auxiliary controlling voltage.

8. A semiconductor device according to claim 7, wherein said semiconductor region between said control electrode and said one current electrode has an impurity concentration and dimensions such that the product of the resistance $r_s$ from said one electrode to said control electrode and the intrinsic transconductance $G_m$ of the semiconductor device can be varied over a wide range in accordance with the auxiliary control voltage.

9. A semiconductor device according to claim 8, wherein said impurity concentration and dimensions of said semiconductor region between said control electrode and said one current electrode are such that said product $G_m \cdot r_s$ can be changed from a state $G_m \cdot r_s < 1$ to a state $G_m \cdot r_s > 1$ by the application of said auxiliary control voltage.

10. A semiconductor device according to claim 4, wherein said second mentioned control electrode comprises a structure capable of influencing the profile of effective current channel by the auxiliary control voltage.

11. A semiconductor device according to claim 4, wherein said second mentioned control electrode comprises a structure capable of injecting charge carriers into said semiconductor region thereby changing the negative feed-back resistance from said one current electrode to said control electrode.

12. A field effect semiconductor device according to claim 4, wherein said semiconductor device further comprises a junction between said control electrode and said high resistivity region, and said impurity concentration and width of said channel is such that said channel is substantially occupied by a depletion layer in the absence of said control voltage.

13. A semiconductor device according to claim 4, wherein at least one of said control electrodes is formed of a metal-insulator-semiconductor structure.

14. A semiconductor device according to claim 4, wherein at least one of said control electrodes is formed of a metal-semiconductor structure.

15. A semiconductor device according to claim 4, wherein at least one of said control electrodes is formed of a semiconductor region having a conductivity type opposite to that of said semiconductor region to form a p-n junction therewith.

* * * * *